(12) United States Patent
Dutta et al.

(10) Patent No.: US 11,462,583 B2
(45) Date of Patent: Oct. 4, 2022

(54) EMBEDDING MAGNETO-RESISTIVE RANDOM-ACCESS MEMORY DEVICES BETWEEN METAL LEVELS

(71) Applicant: International Business Machines Corporation, Armonk, NY (US)

(72) Inventors: Ashim Dutta, Menands, NY (US); Chih-Chao Yang, Glenmont, NY (US); Daniel Charles Edelstein, White Plains, NY (US); John Arnold, North Chatham, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 16/672,752

(22) Filed: Nov. 4, 2019

(65) Prior Publication Data
US 2021/0134883 A1 May 6, 2021

(51) Int. Cl.
*H01L 27/22* (2006.01)
*H01L 43/12* (2006.01)
*H01L 23/528* (2006.01)
*H01L 43/02* (2006.01)

(52) U.S. Cl.
CPC .......... *H01L 27/228* (2013.01); *H01L 23/528* (2013.01); *H01L 43/02* (2013.01); *H01L 43/12* (2013.01)

(58) Field of Classification Search
CPC . H01L 23/522; H01L 23/528; H01L 23/5283; H01L 23/53209; H01L 23/53261; H01L 23/53266; H01L 23/53295; H01L 27/224; H01L 27/228; H01L 43/02; H01L 43/10; H01L 43/12
See application file for complete search history.

(56) References Cited

U.S. PATENT DOCUMENTS

| | | | |
|---|---|---|---|
| 9,343,659 B1 | 5/2016 | Lu et al. | |
| 9,406,875 B2 | 8/2016 | Li et al. | |
| 9,564,582 B2 | 2/2017 | Palaka et al. | |
| 9,634,243 B1* | 4/2017 | Chuang | H01L 27/228 |
| 9,780,301 B1 | 10/2017 | Chuang et al. | |
| 9,893,278 B1* | 2/2018 | Chuang | H01L 27/228 |
| 9,978,934 B2 | 5/2018 | Paranjpe et al. | |

(Continued)

FOREIGN PATENT DOCUMENTS

CN 109713006 A * 5/2019

*Primary Examiner* — Shahed Ahmed
*Assistant Examiner* — Sun Mi Kim King
(74) *Attorney, Agent, or Firm* — Fleit Intellectual Property Law; Thomas Grzesik

(57) ABSTRACT

A semiconductor device structure includes a metallization stack that has one or more patterned metal layers in a logic area and a memory area. At least one memory device is disposed above the metallization stack. A first level logic metal layer is coupled to a patterned metal layer of the one or more patterned metal layers in the logic area. A first level memory metal layer is formed above the first level logic metal layer and is coupled to a top electrode of the memory device stack. A distance between the one or more patterned metal layers in the logic area and the first level logic metal layer is smaller than the distance between the one or more patterned metal layers in the memory area and the first level memory metal layer.

17 Claims, 9 Drawing Sheets

(56) References Cited

U.S. PATENT DOCUMENTS

| | | |
|---|---|---|
| 9,997,562 B1 | 6/2018 | Wang et al. |
| 10,008,387 B1 | 6/2018 | Wang et al. |
| 2013/0119494 A1 | 5/2013 | Li et al. |
| 2016/0093668 A1* | 3/2016 | Lu ..................... H01L 21/76802 |
| | | 257/421 |
| 2016/0365505 A1 | 12/2016 | Lu et al. |
| 2017/0092693 A1* | 3/2017 | Tan ........................ H01L 43/08 |
| 2018/0033957 A1 | 2/2018 | Zhang et al. |
| 2018/0374895 A1* | 12/2018 | Hsu ........................ H01L 43/12 |
| 2020/0006634 A1* | 1/2020 | Brockman ............ H01L 23/528 |
| 2020/0066580 A1* | 2/2020 | Peng ..................... H01L 27/228 |
| 2020/0075669 A1* | 3/2020 | Chuang .................. H01L 43/08 |
| 2020/0083428 A1* | 3/2020 | Weng ...................... H01F 41/34 |
| 2020/0098982 A1* | 3/2020 | Chuang .................. H01L 43/12 |
| 2021/0074907 A1* | 3/2021 | Wang ..................... H01L 43/12 |
| 2021/0091139 A1* | 3/2021 | Tseng ................... H01L 27/228 |
| 2021/0098529 A1* | 4/2021 | Chuang .................. H01L 43/10 |

* cited by examiner

EMBEDDING MAGNETO-RESISTIVE RANDOM-ACCESS MEMORY DEVICES BETWEEN METAL LEVELS

BACKGROUND OF THE INVENTION

The present invention generally relates to the field of semiconductors, and more particularly relates to fabricating embedded memory devices.

Memory devices are often embedded or integrated on-chip to realize various advantages such as reduced chip number, increased response times, etc. Embedded memory devices may utilize technologies such as magnetic tunnel junctions, phase change materials, and/or the like. Components of the embedded memory devices are often susceptible to damage during subsequent processing and integration operations. For example, during etching of the magnetic tunnel junction stack significant damage to or removal of the dielectric layer under the bottom electrode may occur. This may result in exposed and contaminated lines within the interconnect level.

SUMMARY OF THE INVENTION

In one embodiment, a method for forming an embedded memory device comprise forming a structure comprising a metallization stack comprising one or more patterned metal layers and a dielectric cap layer formed over the metallization stack. The metallization stack comprises a logic area and a memory area. At least at least one memory device stack is formed over the dielectric cap layer in the memory area. A first level logic metal layer is formed that is coupled to a patterned metal layer of the one or more patterned metal layers in the logic area. After the first level logic metal layer has been formed, a first level memory metal layer is formed above the first level logic metal layer and coupled to a top electrode of the memory device stack.

In another embodiment, a semiconductor device structure comprises a metallization stack comprising one or more patterned metal layers in a logic area and a memory area. At least one memory device is disposed above the metallization stack. A first level logic metal layer is coupled to a patterned metal layer of the one or more patterned metal layers in the logic area. A first level memory metal layer is formed above the first level logic metal layer and coupled to a top electrode of the memory device stack. A distance between the one or more patterned metal layers in the logic area and the first level logic metal layer is smaller than the distance between the one or more patterned metal layers in the memory area and the first level memory metal layer.

In further embodiment, a semiconductor device structure comprises a memory device formed on a metallization stack comprising one or more patterned metal layers in a logic area and a memory area. The memory device comprises bottom electrode, a bottom electrode contact, a top electrode, and a magnetic tunnel junction disposed between the top electrode and the bottom electrode. A first level logic metal layer is coupled to a patterned metal layer of the one or more patterned metal layers in the logic area. A first level memory metal layer is formed above the first level logic metal layer and coupled to the top electrode of the memory device. A distance between the one or more patterned metal layers in the logic area and the first level logic metal layer is smaller than the distance between the one or more patterned metal layers in the memory area and the first level memory metal layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
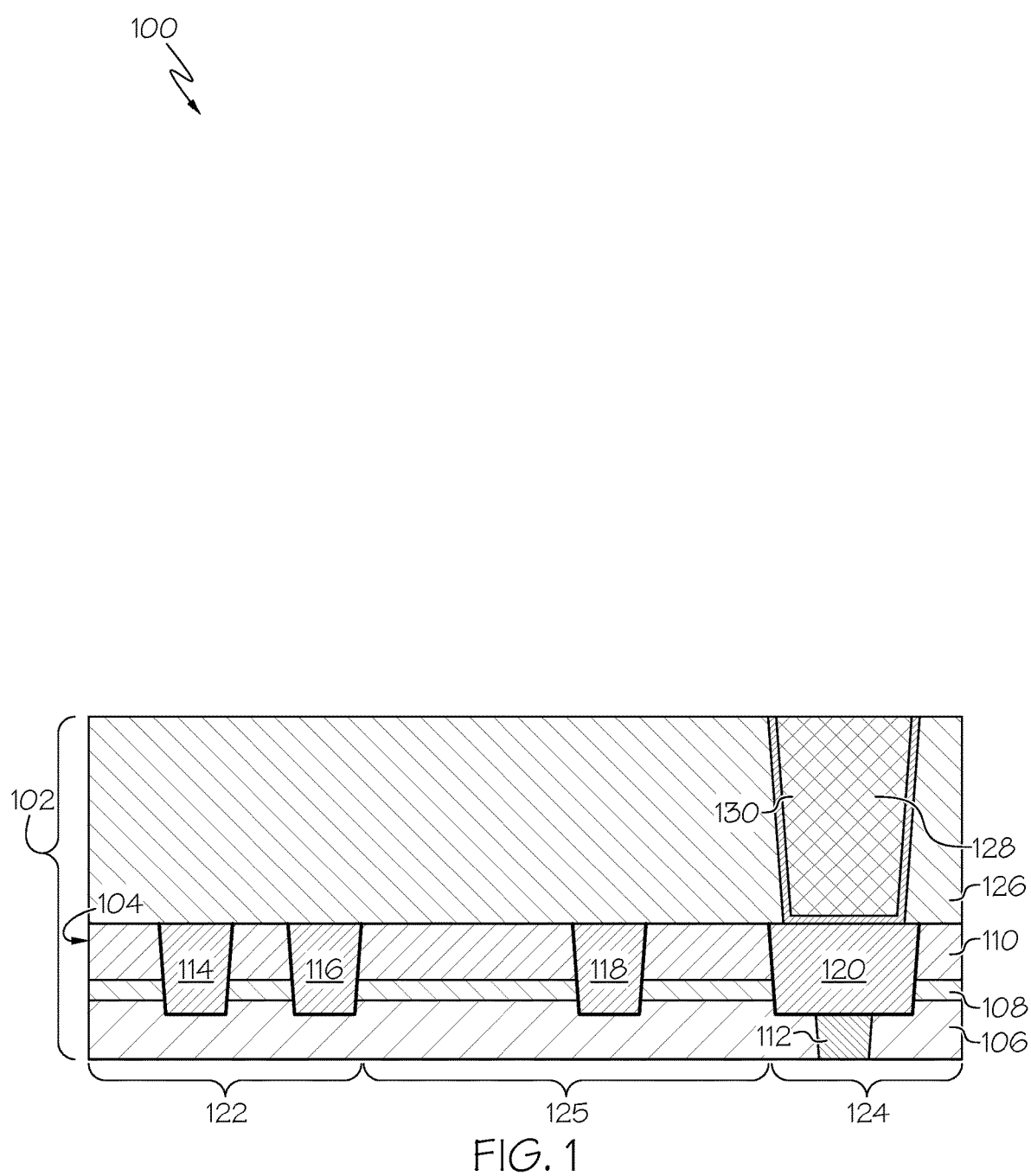
FIG. 1 is a cross-sectional view of a semiconductor device structure after a metallization stack, dielectric cap layer, and bottom electrode contact have been formed according to one embodiment of the present invention.

It is to be understood that embodiments of the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal may be any process that removes material from the wafer; examples include etch processes (either wet or dry) and chemical-mechanical planarization (CMP).

Patterning refers to the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed by plasma ashing.

As noted above, components of the embedded memory devices are often susceptible to damage during subsequent processing and integration operations. For example, conventional fabrication processes generally deposit a dielectric cap layer having a thickness/height in the range of ~10 nm to ~100 nm. The limited thickness of conventional dielectric cap layers is problematic for the MRAM pillar formation since dielectric gouging caused by ion beam etching (IBE) and clean-up results in the undesired formation of a bottom electrode foot and metal residue on the magnetic tunnel junction (MTJ) sidewalls. Undesirable etching of the dielectric layer may result in a significant or complete removal of the dielectric layer in the open region (e.g., logic area) outside the memory array area thereby exposing underlying patterned metal layers within the logic area. This is a significant concern for device and downstream processing due to patterned metal layer contamination.

As will be discussed in greater detail below, one or more embodiments of the present invention overcome this problem by, for example, fabricating a thicker dielectric cap layer and taller MRAM pillar than conventional processes without impacting logic area RC value. This allows for longer IBE over-etch and clean-up to be performed resulting in no electrode footing or metal residue on the MTJ sidewall. The resulting cap dielectric layer that covers the underlying metal lines in the logic area is thicker than conventional cap dielectric layer thereby preventing metal migration from the underlying lines. Embodiments provide sufficient dielectric to absorb IBE over-etch without increasing the distance between the metal layers in the logic area (i.e. without changing resistance-capacitance product (RC) characteristics of logic area interconnects) Extra dielectric in logic area and underneath MRAM pillars in the memory area may be created by depositing a thicker cap dielectric and forming taller bottom electrode contact (BEC). In the logic area, additional thickness of cap dielectric prevents IBE from exposing underlying metal lines. Thicker dielectric in the memory area may be accommodated by separating top interconnect metal layers in the memory area from that of the logic area. The memory area top interconnect layer may be moved up to accommodate the memory pillar with taller bottom electrode contact and may be connected to same top metal layer in the logic area through one or more vias.

FIGS. 1-8 illustrate various processes for fabricating embedded memory devices according to one or more embodiments of the present invention. Referring now to FIG. 1, a semiconductor structure 100 is illustrated at point in time of the fabrication process after a metallization material stack 102 has been formed. In this example, the structure 100 comprises the metallization material stack 102 that includes one or more layers. A first or bottom portion 104 of the stack 102 may be disposed directly on a semiconductor stack. The bottom portion 104 of the stack 102 may be comprised of one or more layers including a first layer 106, a second layer 108, a third layer 110, etc.

The first layer 106 may comprise tetraethyl orthosilicate (TEOS), an oxide; a moderate-k, low-k, or ultra-low-k dielectric, and/or the like. The second layer 108 may be disposed on and in contact with the first layer 106 and may comprise a capping material such as silicon carbide, hydrogen and nitrogen doped silicon carbide, silicon nitride, and/or the like. The third layer 110 may be disposed on and in contract with the second layer 108 and comprise an insulating material such as a low-k dielectric, ultra-low-k dielectric, and/or the like. It should be noted that embodiments are not limited to the layers of the bottom portion 104 of the stack 102 shown in FIG. 1 as additional layers may be added and/or one or more layers may be removed.

The bottom portion 104 of the stack 102 may be referred to as the "Mx layer 104" and may comprise patterned Mx metal layers/wires 112 to 120 embedded therein. In the example shown in FIG. 1, one or more patterned Mx metal layers 112 are embedded within the first layer 106 while one or more Mx patterned metal layers 114 to 120 may be embedded within the first layer 106, second layer 108, and third layer 110 of the Mx layer 104. The one or more patterned Mx metal layers 112 embedded within the first layer 106 may be a middle-of-line contact an may comprise tungsten, copper, cobalt, ruthenium, tantalum nitride, titanium nitride, aluminum, a combination thereof, and/or the like. Patterned Mx metal layers 114 to 120, in one example, may be metallization contacts comprising, tungsten, copper, cobalt, ruthenium, and/or the like. At least a first set of patterned Mx metal layers 114, 116 may be disposed within a logic area 122 of the structure 100; a second set of Mx patterned metal layers 118 may be disposed within a memory area 124 of the structure 100; and a third set of Mx patterned metal layers 120 may be disposed within a logic to memory boundary area 125 of the structure 100.

A second or top portion 126 of the metallization stack 102 may be disposed on the bottom portion 104 of the metallization stack 102. Although the metallization material stack 102 may include the top portion 126 disposed directly on the bottom portion 104, in various embodiments the metallization material stack 102 may include one or more intervening metallization layers between the bottom and top portions 104, 126. That is, the top portion 126 of the metallization stack 102 would be disposed on one or more intervening metallization layers, or other material layers, which would be disposed on the bottom portion 104 of the metallization stack 102.

In some examples, a dielectric insulating layer (not shown) may separate the second metallization layer 108 from the first metallization layer 106. This dielectric insulating layer may be used to separate at least some metal wiring, circuits, and junctions, in the second metallization layer 108 from making direct electrical contact with metal wiring, circuits, and junctions, in the first metallization layer 106. The dielectric insulating layer may be removed at selected locations to allow electrical interconnection, e.g., wiring and junctions, to extend from the second metallization layer 108 down to the first metallization layer 106, and/or further below to a semiconductor stack (not shown). The dielectric insulating layer may include, for example, dielectric material such as silicon oxide or carbon-doped oxide, or other low K dielectrics.

In one embodiment, the top portion 126 of the metallization stack 102 may comprise one or more dielectric materials such as silicon carbonitride (SiCN:H), silicon carbide, hydrogen and nitrogen doped silicon carbide, silicon nitride, and/or the like. Accordingly, at least in some embodiments, the top portion 126 of the metallization stack 102 may also be referred to as "the first dielectric cap layer 126". In some embodiments, the thickness/height of the first dielectric cap layer 126 may range from ~10 nm to ~100 nm although other thicknesses/heights are applicable as well. As discussed above, the thicker dielectric cap layer 126 allows for an MRAM pillar to be formed with a taller bottom electrode contact than conventional MRAM devices, and further prevents/reduces the risk of metal migration from underlying metal lines.

The top portion 126 of the metallization stack 102 may comprise one or more electrode contacts 128 (also referred to herein as the "bottom electrode contact 128") within the memory area 124. In this example, the top surface of the bottom electrode contact 128 may be planar with a top surface of the top portion 126 of the metallization stack 102 and a bottom surface of the electrode contact 128 contacts a top surface of the patterned metal layer 118 within the memory area 124. The bottom electrode contact 128 may comprise metals such as (but not limited to) tungsten, copper, cobalt, ruthenium, tantalum nitride, titanium nitride, aluminum, and/or the like. A liner 130 may be formed within the contact trench prior to forming the bottom electrode contact 128. The liner may comprise cobalt, tungsten, tungsten nitride, tantalum nitride, titanium nitride, aluminum, and/or the like. In one embodiment, the bottom electrode contact 128 may be formed using a damascene process where metal is deposited inside the trench having sidewall liners like such as (but not limited to) titanium nitride, tantalum nitride, ruthenium, etc. In another embodiment, the bottom electrode contact 128 may be formed using a subtractive etch process.

Figure 2:
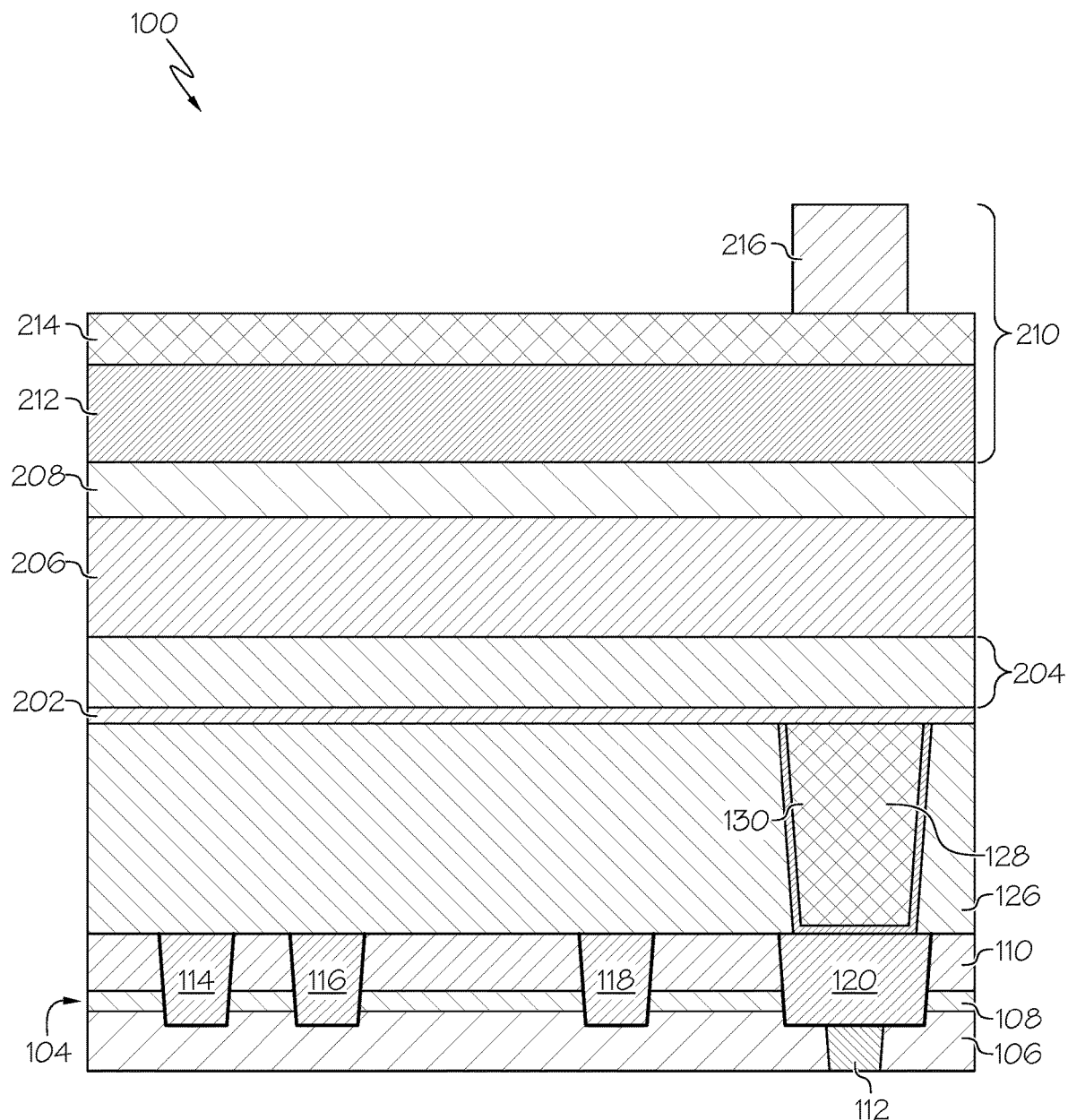
FIG. 2 is a cross-sectional view of the semiconductor device structure a memory device layer stack and patterning stack have been formed on the dielectric cap layer according to one embodiment of the present invention.

FIG. 2 shows that a first electrode layer 202 (also referred to herein as "bottom electrode layer 202") is formed on and in contact with a top surface of the bottom electrode contact 128; a top surface of the liner 130; and a top surface of the first dielectric cap layer 126. The bottom electrode layer 202 may comprise materials such as (but not limited to) tungsten, tungsten nitride, tantalum, tantalum nitride, titanium, titanium nitride, ruthenium, aluminum, other high melting point metals, conductive metal nitrides, a combination thereof, and/or the like.

MTJ stack layers 204 may then be formed on the bottom electrode layer 202. The MTJ stack layers may comprises a first magnetic layer formed on and in contact with the bottom electrode layer 202. An insulating layer (e.g., tunnel barrier) may then be deposited over and in contact with the first magnetic layer. A second magnetic layer may then be deposited over and in contact with the insulating layer. Additional insulator and magnetic layers may be added. The first and second magnetic layers may comprise a magnetic material such as, but not limited to, cobalt (Co), iron (Fe), boron (Ba, CoFeB alloys, Co/Pt multilayers, Co/Ni multilayers, similar ferromagnetic multilayer materials or alloys with transition metals or rare earth metals, any combination thereof, and/or the like. The insulating layer may comprise materials such as, but not limited to, magnesium oxide (MgO), aluminum oxide (AlOx), and/or the like. It should be noted that additional barrier layers (not shown) may also be formed/deposited as part of the MTJ stack as well.

One of the magnetic layers has a high level of magnetization and is fixed/pinned (reference layer). The other magnetic layer has a lower amount of magnetization and is referred to as the free layer (i.e., not pinned). The free layer is able to rotate its magnetization to be parallel with the pinned layer or anti-parallel to the pinned layer. Parallel magnetizations allow current to tunnel through the tunnel barrier resulting in low resistance. Anti-parallel magnetizations do not allow current to tunnel through the tunnel barrier resulting in high resistance. The magnetizations can be controlled either by passing current through a different copper line so that the current induces a magnetic field that interacts with the free layer or by directly injecting spin polarized current into the device which produces a torque on the magnetic free layer.

FIG. 2 further shows a second electrode layer 206 (also referred to herein as "top electrode layer 206") may be formed on and in contact with the top-most layer of the MTJ stack layers 204. For example, the top electrode layer 206 may be formed on and in contact with the second magnetic layer. The top electrode layer 206 may comprise metals such as (but not limited to) tungsten, copper, cobalt, ruthenium, tantalum nitride, titanium nitride, aluminum, and/or the like. After the top electrode layer 206 has been formed a hardmask layer 208 may be formed thereon. The hardmask layer 208 may comprise a material such as (but not limited to) TEOS), an oxide; a moderate-k, low-k, or ultra-low-k dielectric, and/or the like.

A patterning stack 210 may be formed over the hardmask layer 208. The patterning stack 210 may be a tri-layer stack, quad-layer stack, or any other applicable patterning stack configuration. In the example shown in FIG. 2, the patterning stack 210 comprises an organic planarization layer (OPL) 212, an anti-reflective coating (ARC) 214, and a photoresist layer 216. The OPL 212 may include a material (s) such as spin-on carbon (SOC), diamond-like carbon, polyarylene ether, polyimide, polymethyl methacrylate, polymethylisopropenyl ketone, photoresists, and/or the like. The OPL 212 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL.

The ARC layer 214 may comprise a silicon-ARC, titanium-ARC, and/or the like. The ARC layer 214 may be formed by, for example, one or more processes including sputtering, evaporation, CVD, PVD, ALD, and/or the like. The photoresist layer 216 (shown as being patterned) may comprise a material that is sensitive to one or more types of patterning processes such extreme ultraviolet (EUV) light patterning and/or the like. The photoresist layer 216 may be deposited using one or more processes such as CVD, PVD, ALD, and/or the like.

The photoresist layer 216 may be patterned using any suitable photolithography technique. For example, in on embodiment, a photomask is disposed over the photoresist layer 216. The photoresist layer 216 may then be exposed to a radiation beam, and then hardened via a curing or baking process. Unexposed or exposed portions of the photoresist layer may then be removed using a developer. The foregoing process results in the desired pattern. The pattern includes portions of the photoresist layer 216 in contact with ARC layer 214 while other portions of the ARC layer 214 remain exposed. In some embodiments, the portions of the photoresist layer 216 may be trimmed using, for example, an anisotropic plasma etch process.

After the photoresist layer 216 has been patterned, the pattern is transferred down to the top electrode layer 138. For example, a selective etching process may be used to first transfer the pattern to the ARC layer 214. A separate selective etching process may then be used to transfer the pattern to the OPL 212. Alternatively, the ARC layer 214 and the OPL 212 may be etched using a single etching process. One or more etching processes may then be used to transfer the pattern down to each hardmask layer 208 and then down to the top electrode layer 206. The etching process, in one embodiment, stops on the MTJ stack layers 204. Any remaining photoresist layer 216; ARC layer 214, and OPL 212 may be removed by, for example, reactive ion etches (RIE).

Figure 3:
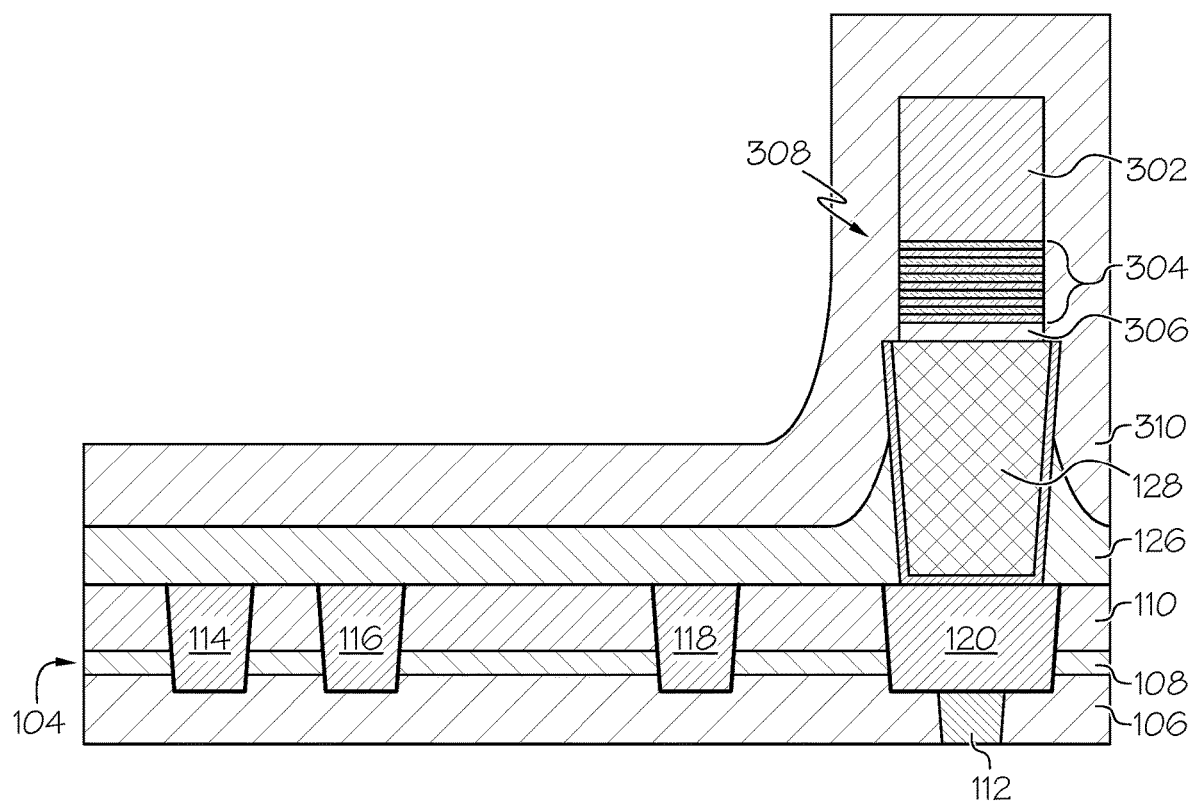
FIG. 3 is a cross-sectional view of the semiconductor device structure after the memory device layer stack has been patterned and an encapsulation layer has been formed over the memory device layers according to one embodiment of the present invention.

FIG. 3 shows the above patterning process forms one or more top electrodes 302 over a one or more patterned metal layers 120 and disposed within the memory area 124 of the structure 100. One or more additional etching processes such as ion beam etching (IBE) are performed to pattern the MTJ stack layers 204 and bottom electrode layer 202 using the top electrode 302 and patterned hard mask 208 as a patterning stack. This etching process forms an MTJ stack 304 and a bottom electrode 306 under the top electrode 302. During etching of the MTJ stack 304 using IBE, the hard mask 208 along with some portion of the top electrode 302 may be etched away. The resulting structure comprising at least the top electrode 302; MTJ stack 304; and bottom electrode 306 are herein referred to as a "magneto-resistive random access memory (MRAM) stack/pillar 308" and/or "memory device 308". The increased thickness of the dielectric layer 126 prevents the significant or complete removal of the dielectric layer 126 in the open region (e.g., logic area 122) outside the memory array area 124.

FIG. 3 further shows that an encapsulation layer 310 may then be formed dover the structure. The encapsulation layer 310 may be formed by depositing a material such as a silicon carbide, hydrogen and nitrogen doped silicon carbide, silicon nitride, and/or the like over and in contact with the top surface of the first dielectric cap layer 126, sidewalls of the bottom electrode 306; sidewalls of the MTJ stack 304; sidewalls of the top electrode 302; and a top surface of the top electrode 302. The encapsulation layer 310 may be deposited using a passivation layer deposition process such as CVD, PECVD, and/or any other applicable process. The encapsulation layer 310 protects the memory device from degradation due to exposure to ambient oxygen and moisture as well as from any damages during later processing operations. After the encapsulation layer 310 has been formed an etching process such as reactive ion etching (RIE) process may be performed to remove portions of the encapsulation layer 310 from horizontal surfaces of the structure 100. This process forms a spacer on the sidewalls of the MTJ stack 304 from the etched encapsulation layer 310.

Figure 4:
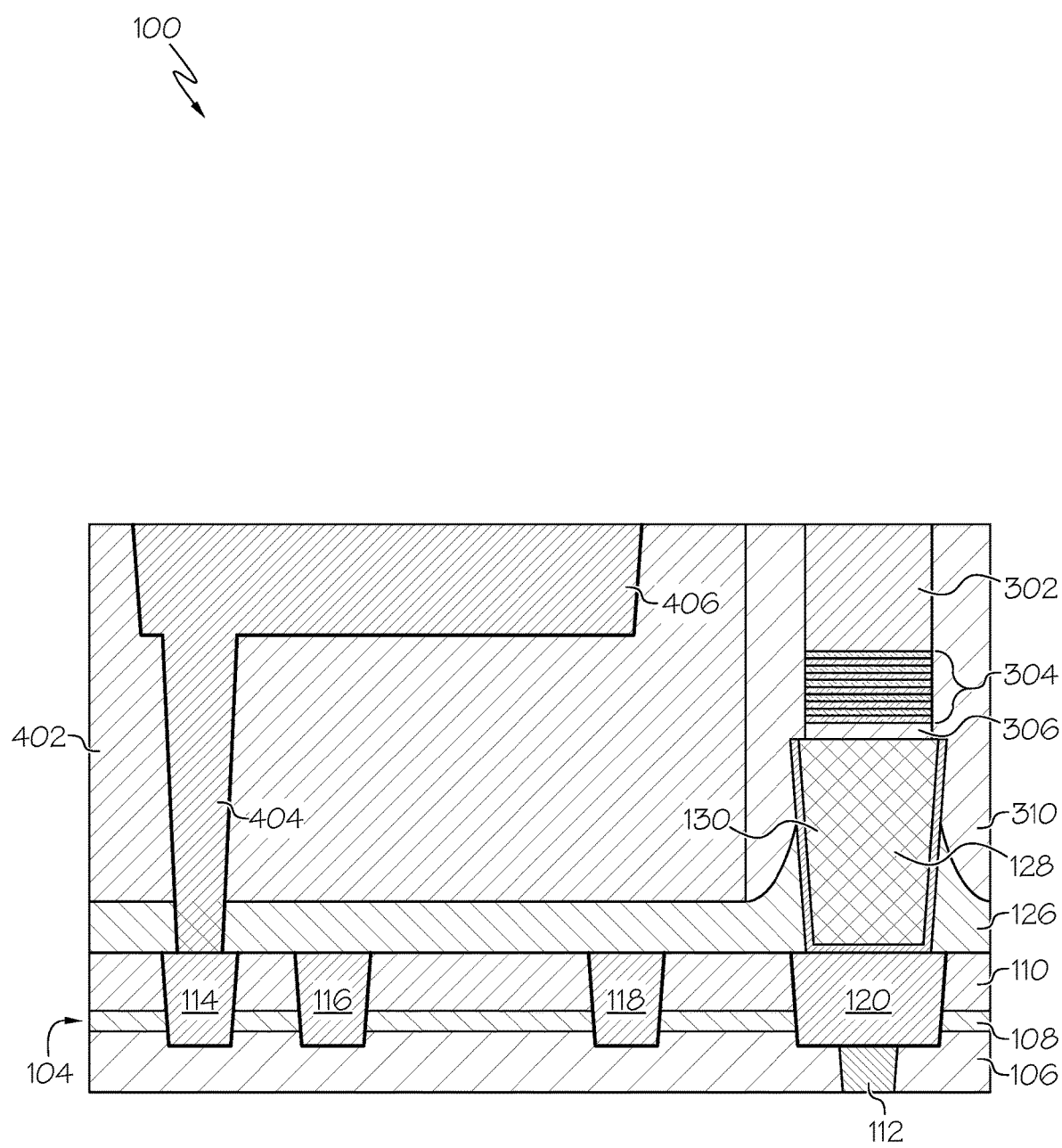
FIG. 4 is a cross-sectional view of the semiconductor device structure after a first level logic metal layer and via have been formed according to one embodiment of the present invention.

After etching of the encapsulation layer 310, a first inter-layer dielectric (ILD) layer 402 may be formed over the entire structure and polished back to form an Mx+1 layer, as shown in FIG. 4. The first ILD 402 may be formed using a deposition method, such as CVD, PECVD, deposition from chemical solution, or spin on deposition. One or more Mx+1 logic area interconnects/contacts may also be formed within the Mx+1 layer utilizing, for example, a dual damascene process. For example, a patterning stack may be formed on and in contact with the first ILD 402. The stack may comprise multiple hardmask layers such as sacrificial nitride, titanium nitride, oxide, and/or the like. The stack may also comprise a tri-layer or quad layer lithography stacks. For example, the stack may comprise an OPL, an ARC layer, and a photoresist layer similar to those discussed above with respect to FIG. 2. The photoresist layer may be patterned using any suitable photolithography technique similar to the processes discussed above with respect to FIG.

2. The patterning process forms one or more vias/trenches for the contacts/interconnects within the first ILD 402 and down into the first dielectric cap layer 126. A first set of the trenches with via exposes at least a portion of the top surface of one or more of the patterned Mx metal layers 114 within the logic area 122.

A metal fill process may then be performed to fill the via(s) to form one or more Vx logic contacts/interconnects 404 and to also fill the remaining portion of the trench to form one or more Mx+1 logic metal layers/wires 406 within the logic area 122, wherein the Vx logic interconnect 404 and the Mx+1 logic metal layer 406 are coupled to each other. In one embodiment, the Mx+1 logic metal layer 406 may extend into the logic to memory boundary area 125 of the structure 100. A barrier liner such as cobalt, tungsten, tungsten nitride, tantalum nitride, titanium nitride, aluminum, and/or the like may be first formed within the trenches and vias using, for example, CVD or ALD. A copper seed may then be deposited via PVD followed by copper plating, though chemical vapor deposition (CVD) techniques could be used as well. Other materials and processes may be utilized to form the Vx logic interconnect 404 and the Mx+1 logic metal layer 406. For example, copper, cobalt, tungsten, aluminum, a combination thereof, and other the like may be used to fill the trenches. The metal may be planarized such that the top surface of the Mx+1 logic metal layer 406 is planar with the top surface of the first ILD 402.

Figure 5:
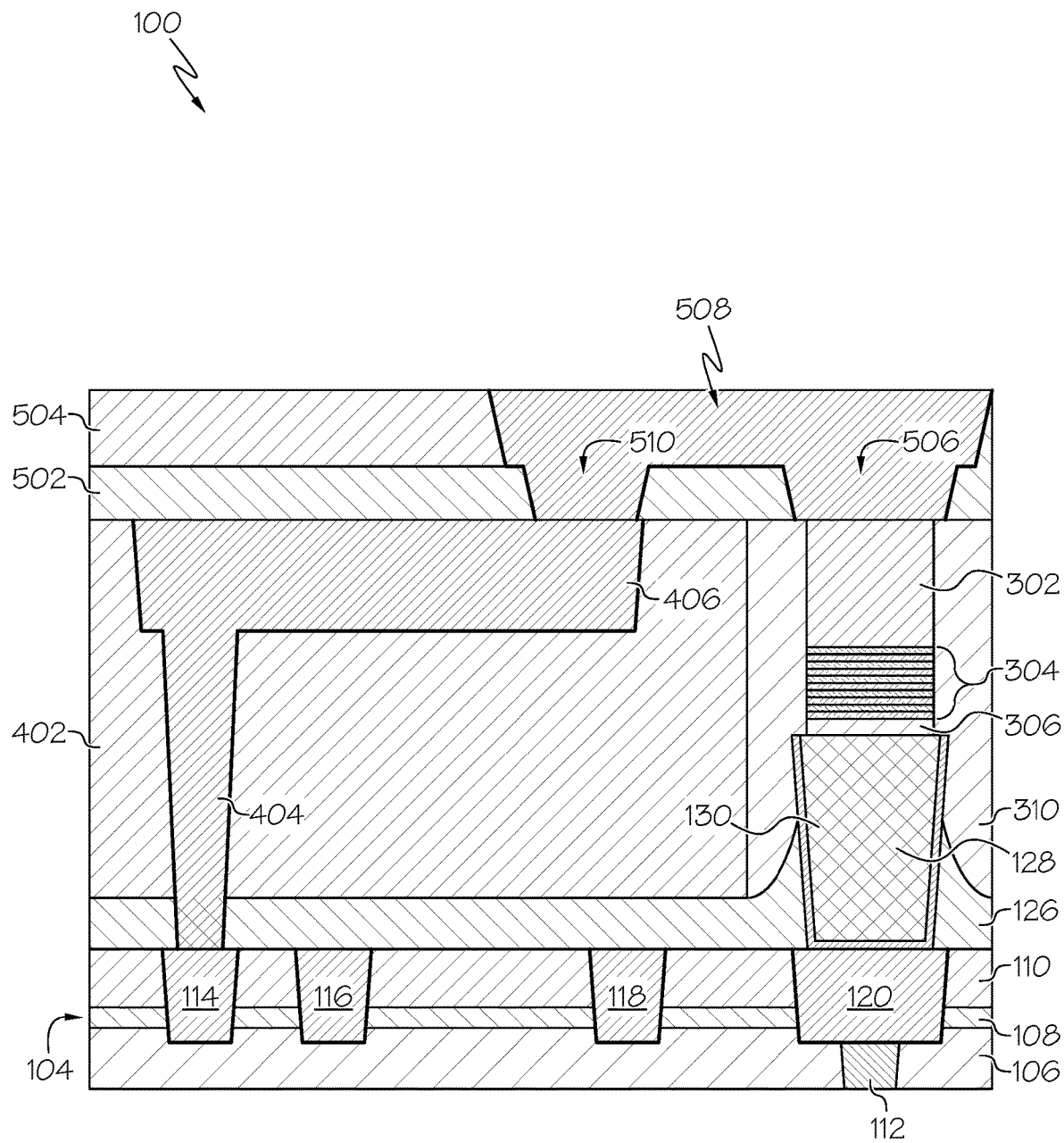
FIG. 5 is a cross-sectional view of the semiconductor device structure after a first level memory metal layer has been formed above the first level logic metal layer according to one embodiment of the present invention.

FIG. 5 shows a second dielectric cap layer 502 may be formed on and in contact with the a top surface of the Mx+1 logic metal layer 406; a top surface of the first ILD 402; a top surface of the top electrode 302; and a top surface of the etched encapsulation layer 310. The second dielectric cap layer 502 may comprise one or more dielectric materials such as silicon carbonitride (SiCN:H), silicon carbide, hydrogen and nitrogen doped silicon carbide, silicon nitride, and/or the like. A second ILD 504 may then be formed on and in contact with a top surface of the second dielectric cap layer 502.

FIG. 5 further shows that a Vx memory contact 506 (also referred to herein as a "top electrode contact 506" and an Mx+1 memory metal layer 508 are formed in the memory area 124. The Mx+1 memory metal layer 508 may extend into the logic-to-memory boundary area 125 and may be coupled to the Mx+1 logic metal layer by one or more interconnects 510. These features may be formed using, for example, a dual damascene process similar to that discussed above with respect to FIG. 4. For example, a patterning stack may be formed on and in contact with the second ILD 504. The stack may comprise multiple hardmask layers such as sacrificial nitride, titanium nitride, oxide, and/or the like. The stack may also comprise a tri-layer or quad layer lithography stacks. For example, the stack may comprise an OPL, an ARC layer, and a photoresist layer similar to those discussed above with respect to FIG. 2.

The photoresist layer may be patterned using any suitable photolithography technique similar to the processes discussed above with respect to FIG. 2. The patterning process forms one or more trenches for the contacts and interconnects within the second ILD 504 and down into the second dielectric cap layer 502. A first via within the trench exposes at least a portion of the top surface of the top electrode 302 within the memory area 124 and a second via within the trench exposes a portion of the top surface of the Mx+1 logic metal layer 406 within the logic area 122 or logic-to-memory boundary area 125. The trench(es) and vias may then be filed with one or more materials to form the Vx top electrode contact 506, Mx+1 memory metal layer 508, and the Mx+1 logic metal layer interconnect 510.

Figure 6:
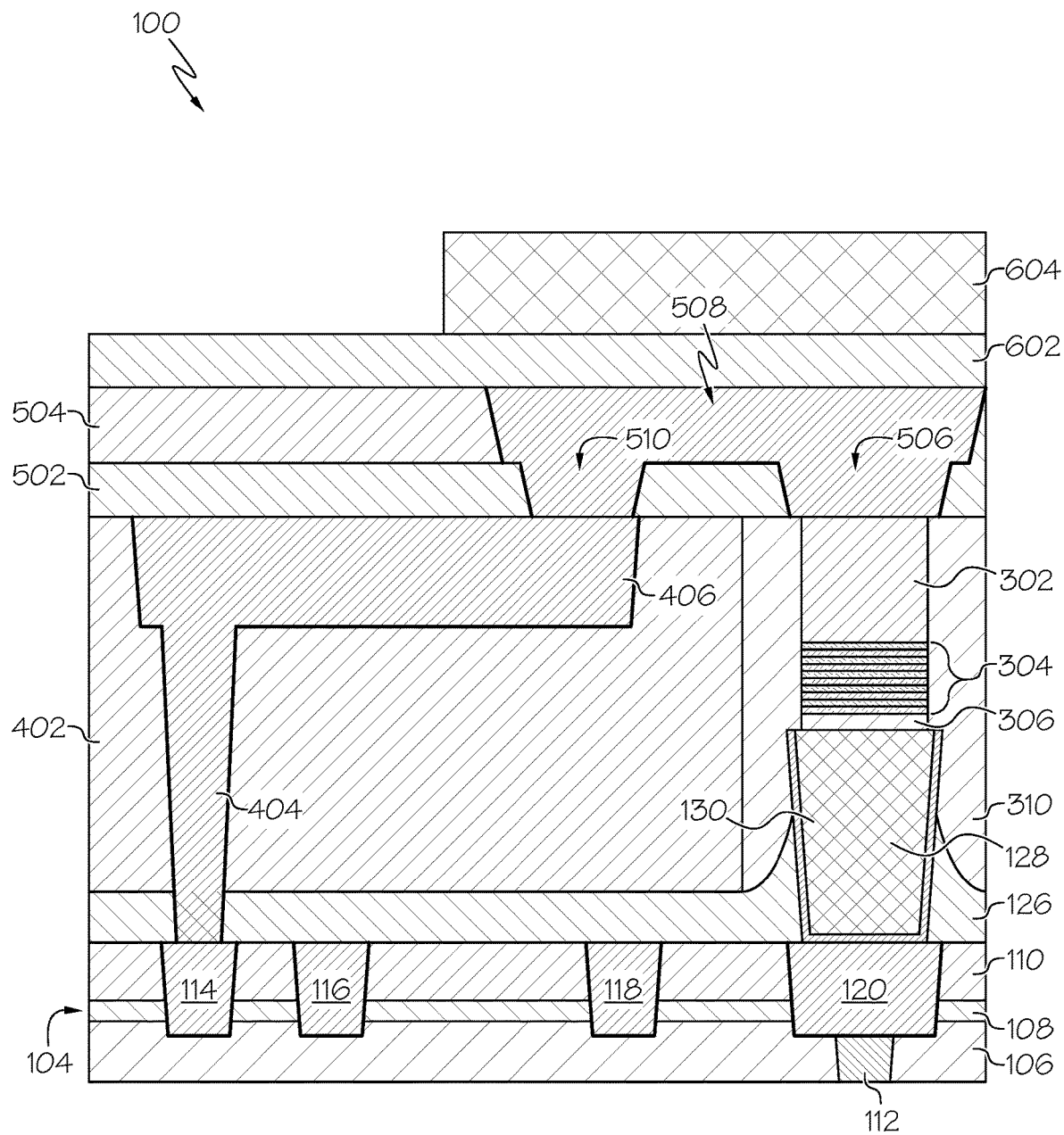
FIG. 6 is a cross-sectional view of the semiconductor device structure after a patterning stack has been formed on the structure according to one embodiment of the present invention.

FIG. 6 shows a third dielectric cap layer 602 formed on and in contact with the top surface of the second ILD 504 and the top surface of the Mx+1 memory metal layer 508. The third dielectric cap layer 602 may comprise one or more dielectric materials such as silicon carbonitride (SiCN:H), silicon carbide, hydrogen and nitrogen doped silicon carbide, silicon nitride, and/or the like. FIG. 6 further shows that a patterning mask/layer 604 may be formed on and in contact with the top surface of the third dielectric cap layer 602 over the memory area 124 and extending over the logic-to-memory boundary area 125. The patterning layer 604 may comprise one or more layers and may be patterned similar to the process discussed above with respect to FIG. 2. However, other patterning processes are applicable as well.

Figure 7:
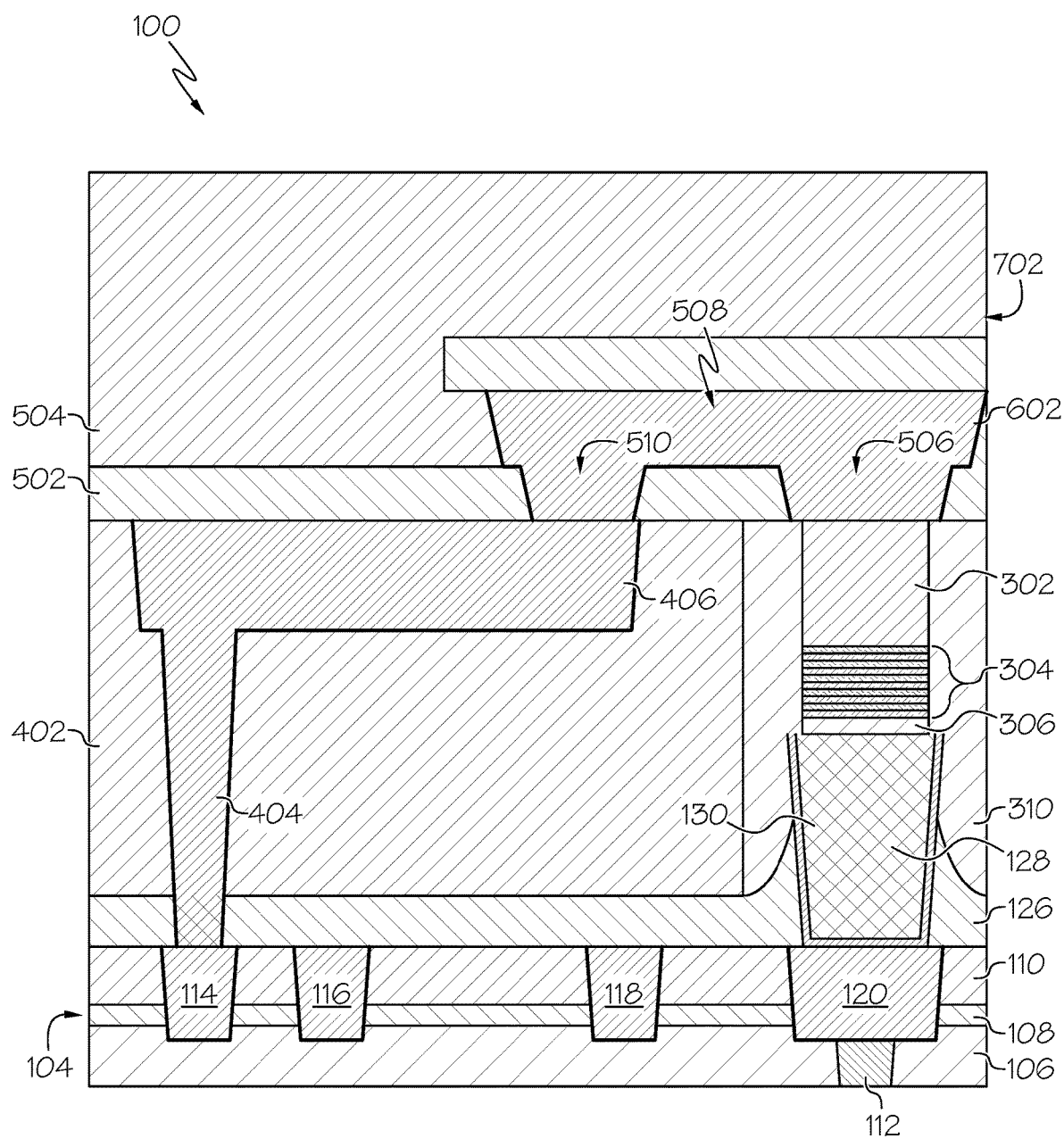
FIG. 7 is a cross-sectional view of the semiconductor device structure after exposed portions of an additional dielectric cap layer formed above the first level memory metal layer has been patterned according to one embodiment of the present invention.

FIG. 7 shows that exposed portions of the third dielectric cap layer 602 may then be removed utilizing an etching process such as RIE. The etching stops at the underlying second ILD 504. The patterning layer 604 may then be removed using one or more etching/stripping processes thereby exposing the top surface of the remaining portion of the etched third dielectric cap layer 602. A third ILD 702 may then be deposited/formed on the top surface of the etched third dielectric cap layer 602 and the top surface of the second ILD 504.

Figure 8:
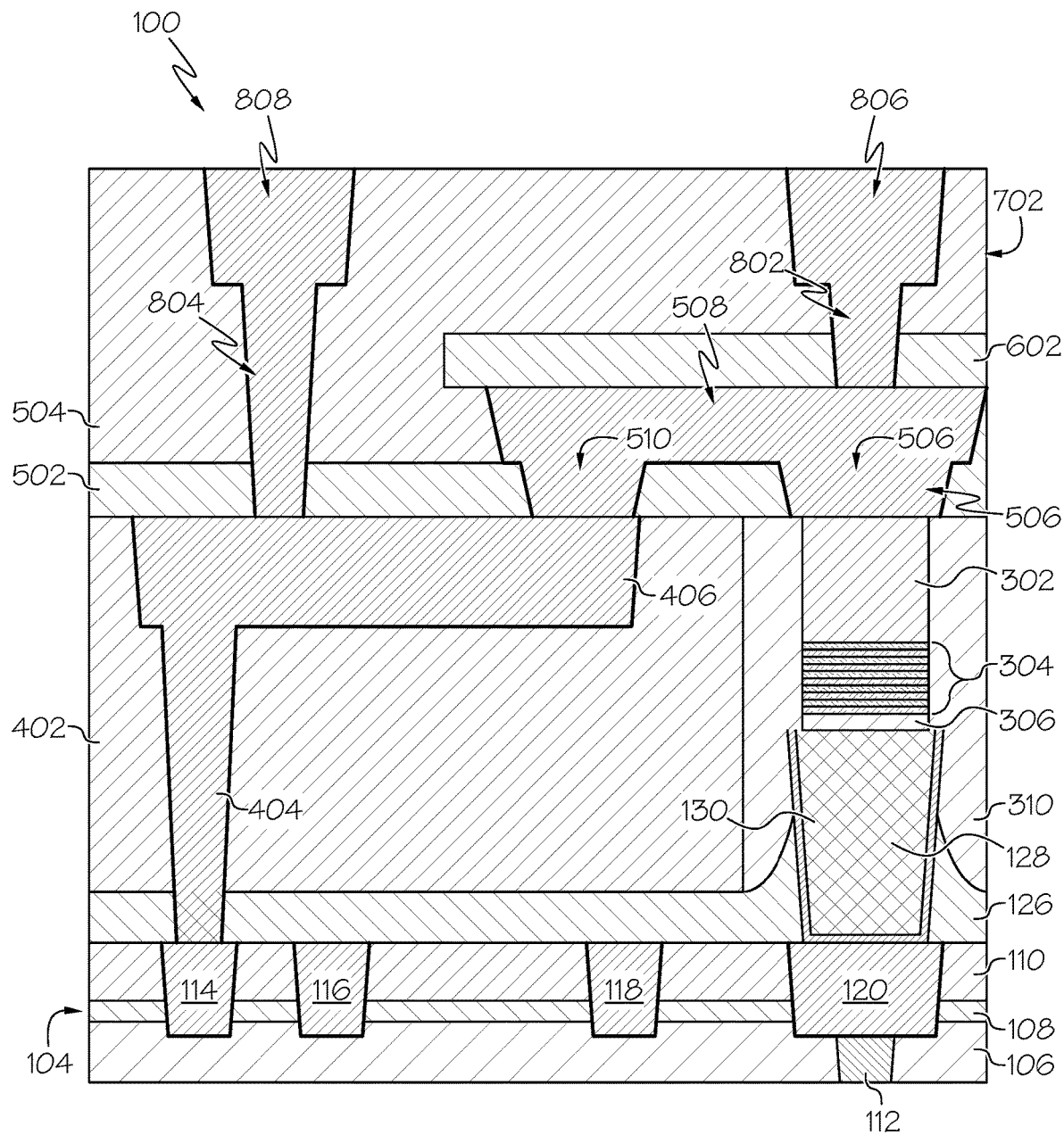
FIG. 8 is a cross-sectional view of the semiconductor device structure after a second level logic metal layer and a second level memory metal layer have been formed according to one embodiment of the present invention.

FIG. 8 shows that after the third ILD 702 is formed, one or more contacts/interconnects 802, 804 and metal layers 806 808 may be formed. For example, a Vx+1 memory interconnect 802 may be formed above and in contact with an Mx+1 memory metal layer 508; a Vx+1 logic interconnect 804 may be formed above and in contact with the Mx+1 logic metal layer 406; an Mx+2 memory metal layer 806 may be formed above and in contact with the Vx+1 memory interconnect 802; and an Mx+2 logic metal layer 808 may be formed above and in contact with the Vx+1 logic interconnect 804. These features may be formed using a process similar to the contacts/interconnects and metal lines/layers discussed above with respect to FIGS. 4 and 5. In one embodiment, the Vx+1 logic interconnect 804 extends below a bottom surface of the Vx+1 memory interconnect 802.

The resulting structure 100, in one embodiment, comprises a thicker dielectric cap layer 126 and taller MRAM pillar than conventional devices without impacting logic area RC values. As discussed above, the thicker/taller dielectric cap layer 126 allows for longer IBE over-etch and clean-up to be performed resulting in no electrode footing or metal residue on the MTJ sidewall. It should be noted that in other embodiments, a taller bottom/top electrode 302, 306 and/or MTJ stack may also be fabricated to achieve the non-conventional height of the MRAM pillar as well. In addition, the distance between two metal layers (e.g., Mx metal layer 120 and Mx+1 metal layer 508) in the memory area 124 is greater than the distance between two metal layers (e.g., Mx metal layer 114 and Mx+1 metal layer 406) in the logic area 122. The metal lines/layers (e.g., Mx+1 metal layer 508) connecting to the memory top electrode 302 are connected to corresponding logic area metal lines/layers (e.g., Mx+1 logic metal layer 406 through one or more vias (e.g., Mx+1 logic metal layer interconnect 510). Also, the distance between Mx+1 metal layer 406 and the Mx+2 metal layer 808 in the logic area 122 is greater than the distance between the Mx+1 metal layer 508 and the Mx+2 metal area 806 in the MRAM area 124.

Figure 9:
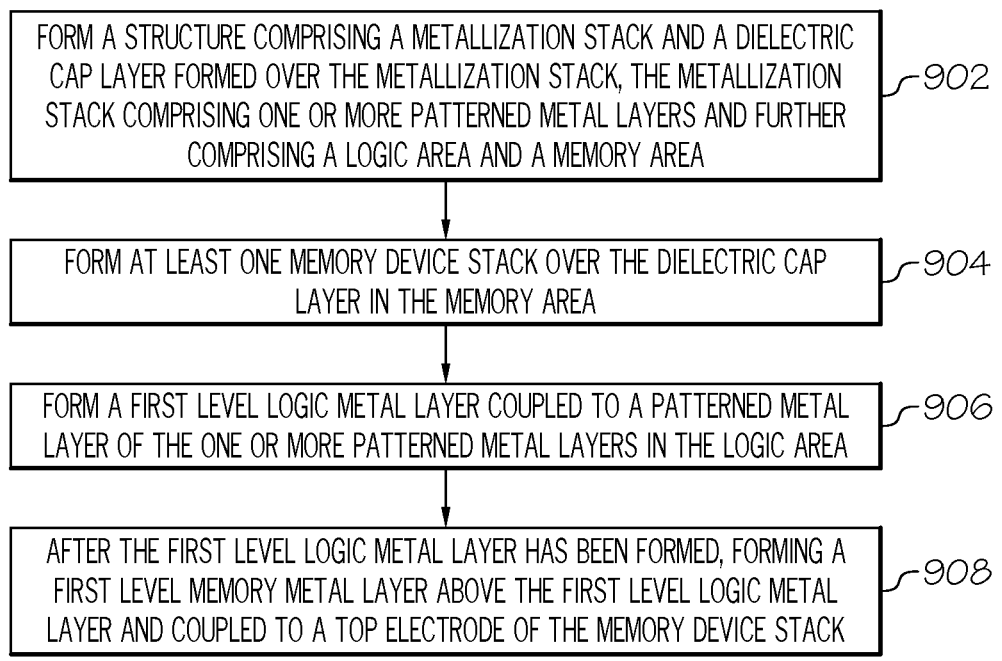
FIG. 9 is an operational flow diagram illustrating one example of a process for forming embedded memory device structure according to one embodiment of the present invention.

FIG. 9 is an operational flow diagram illustrating one example of a process for forming an embedded memory device structure. It should be noted that each of the steps shown in FIG. 9 has been discussed in greater detail above with respect to FIGS. 1 to 8. A structure comprising a metallization stack comprising one or more patterned metal layers and a dielectric cap layer formed over the metallization stack is formed at step 902. The metallization stack comprises a logic area and a memory area. At least one memory device stack is formed over the dielectric cap layer in the memory area at step 904. A first level logic metal layer is coupled to a patterned metal layer of the one or more patterned metal layers in the logic area at step 906. After the first level logic metal layer has been formed, a first level memory metal layer is formed above the first level logic metal layer and coupled to a top electrode of the memory device stack at step 908.

Although specific embodiments of the invention have been taught, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A semiconductor device structure comprising at least:
    a metallization stack comprising one or more patterned metal layers in a logic area and a memory area;
    at least one memory device disposed above the metallization stack;
    a first level logic metal layer coupled to a patterned metal layer of the one or more patterned metal layers in the logic area by a first level interconnect; and
    a first level memory metal layer formed above the first level logic metal layer and coupled to a top electrode of the at least one memory device and the first level logic metal layer.

2. The semiconductor device structure of claim 1, wherein a distance between the one or more patterned metal layers in the logic area and the first level logic metal layer is smaller than the distance between the one or more patterned metal layers in the memory area and the first level memory metal layer.

3. The semiconductor device structure of claim 1, further comprising:
    a dielectric cap layer formed on and in contact with the metallization stack, wherein at least a portion of the dielectric cap layer comprises a height of at least 50 nanometers.

4. The semiconductor device structure of claim 1, wherein the at least one memory device comprises at least:
    a bottom electrode contact comprising a height of at least 50 nanometers.

5. The semiconductor device structure of claim 1, further comprising:
    a second level logic metal layer coupled to the first level logic metal layer; and
    a second level memory metal layer coupled to the first level memory metal layer.

6. The semiconductor device structure of claim 5, wherein a distance between the first level logic metal layer and the second level logic metal layer is greater than a distance between the first level memory metal layer and the second level memory metal layer.

7. The semiconductor device structure of claim 1, wherein the first level logic metal layer is separate from the first level memory metal layer.

8. A semiconductor device structure comprising:
    a memory device formed above a metallization stack comprising one or more patterned metal layers in a logic area and a memory area, the memory device comprising a bottom electrode, a bottom electrode contact, a top electrode, and a magnetic tunnel junction disposed between the top electrode and the bottom electrode;
    a first level logic metal layer coupled to a patterned metal layer of the one or more patterned metal layers in the logic area by a first level interconnect; and
    a first level memory metal layer formed above the first level logic metal layer and
    coupled to the top electrode of the memory device and the first level logic metal layer.

9. The semiconductor device structure of claim 8, wherein a distance between the one or more patterned metal layers in the logic area and the first level logic metal layer is smaller than the distance between the one or more patterned metal layers in the memory area and the first level memory metal layer.

10. The semiconductor device structure claim 8, further comprising:
    a dielectric cap layer formed on and in contact with the metallization stack, wherein at least a portion of the dielectric cap layer comprises a height of at least 50 nanometers.

11. The semiconductor device structure of claim 8, wherein the bottom electrode contact comprises a height of at least 50 nanometers.

12. The semiconductor device structure of claim 8, further comprising:
    a second level logic metal layer coupled to the first level logic metal layer; and
    a second level memory metal layer coupled to the first level memory metal layer.

13. The semiconductor device structure of claim 12, wherein a distance between the first level logic metal layer and the second level logic metal layer is greater than a distance between the first level memory metal layer and the second level memory metal layer.

14. A semiconductor device structure comprising at least:
    a metallization stack comprising one or more patterned metal layers in a logic area and a memory area;
    at least one memory device disposed above the metallization stack;
    a first level logic metal layer coupled to a patterned metal layer of the one or more patterned metal layers in the logic area;

a first level memory metal layer formed above the first level logic metal layer and coupled to a top electrode of the at least one memory device;

a second level logic metal layer coupled to the first level logic metal layer; and a second level memory metal layer coupled to the first level memory metal layer, wherein a distance between the first level logic metal layer and the second level logic metal layer is greater than a distance between the first level memory metal layer and the second level memory metal layer.

15. The semiconductor device structure of claim 14, wherein a distance between the one or more patterned metal layers in the logic area and the first level logic metal layer is smaller than the distance between the one or more patterned metal layers in the memory area and the first level memory metal layer.

16. The semiconductor device structure of claim 14, further comprising:

a dielectric cap layer formed on and in contact with the metallization stack, wherein at least a portion of the dielectric cap layer comprises a height of at least 50 nanometers.

17. The semiconductor device structure of claim 14, wherein the at least one memory device comprises at least:

a bottom electrode contact comprising a height of at least 50 nanometers.

\* \* \* \* \*